United States Patent [19]

Yang

[11] Patent Number: 5,423,119
[45] Date of Patent: Jun. 13, 1995

[54] METHOD FOR MANUFACTURING A HYBRID CIRCUIT CHARGE-COUPLED DEVICE IMAGE SENSOR

[75] Inventor: Thomas Yang, Hsin-Chu, Taiwan, Prov. of China

[73] Assignee: Hualon Microelectronics Corporation, Hsin-Chu, Taiwan, Prov. of China

[21] Appl. No.: 272,034

[22] Filed: Jul. 8, 1994

[51] Int. Cl.⁶ .................. H01L 23/14; H05K 5/06
[52] U.S. Cl. .................................. 29/841; 29/840; 174/52.2; 174/52.3; 228/124.6
[58] Field of Search ............ 29/25.35, 832, 841, 29/DIG. 1, 834, 840; 174/52.2, 52.3, 52.4, 52.5; 156/307.1, 330; 219/603, 604, 605; 228/124.6, 904; 361/760

[56] References Cited

U.S. PATENT DOCUMENTS

| | | | |
|---|---|---|---|
| 3,729,820 | 5/1973 | Ihochi et al. | 29/841 X |
| 3,740,838 | 6/1973 | Brookover et al. | 29/841 X |
| 4,191,905 | 3/1980 | Yasuda et al. | 29/25.35 X |
| 4,372,037 | 2/1983 | Scapple et al. | 174/52.3 X |
| 4,715,115 | 12/1987 | King et al. | 29/841 |
| 4,829,403 | 5/1989 | Harding | 29/841 |

FOREIGN PATENT DOCUMENTS 1765810 2/1971 Germany .......................... 29/841
560500 3/1975 Switzerland .................... 29/841

*Primary Examiner*—Peter Dungba Vo
*Attorney, Agent, or Firm*—Foley & Lardner

[57] ABSTRACT

A method for manufacturing a hybrid circuit-type charge-coupled device image sensor includes the steps of: forming a lead wire unit on a first layout surface of a ceramic base; attaching a charge-coupled device image sensor die on the first layout surface; wire bonding the charge-coupled device image sensor die to the lead wire unit; mounting a window frame on the first layout surface to enclose the charge-coupled device image sensor die by applying a layer of sealing material on a lower peripheral end of the window frame; mounting a glass lid on the window frame by applying another layer of sealing material on an upper peripheral end of the window frame; and heating an assembly of the glass lid, the window frame and the ceramic base in an oven so as to cure and harden the layers of sealing material and bond together the glass lid, the window frame and the ceramic base.

6 Claims, 7 Drawing Sheets

METHOD FOR MANUFACTURING A HYBRID CIRCUIT CHARGE-COUPLED DEVICE IMAGE SENSOR

BACKGROUND OF THE INVENTION

1. Field Of The Invention

This invention relates to a method for manufacturing a charge-coupled device (CCD) image sensor, more particularly to a method for manufacturing a hybrid circuit-type CCD image sensor.

2. Description Of The Related Art

A conventional method for manufacturing a CCD image sensor is shown in FIGS. 1 to 5. Referring to FIG. 1, a lead connecting frame 12 is provided on a ceramic base 16 by means of a sealing layer 18, made of a material such as glass, which is applied on the ceramic base 16. A window frame 14 is mounted on thee lead connecting frame 12 by means of another layer 18 of sealing material on a lower peripheral end of the window frame 14. The assembly of the window frame 14, the lead connecting frame 12 and the ceramic base 16 is then heated so as to melt the sealing layers 18 and bond together the lead connecting frame 12, the window frame 14 and the ceramic base 16.

Referring to FIG. 2, a CCD image sensor die 20 is mounted on the ceramic base 16 by applying a silver epoxy layer 22 on the ceramic base 16. A wire bonder (not shown) is then used to wire bond the bonding pads (not shown) on the image sensor die 20 to the bonding fingers (not shown) of the lead connecting frame 12 with the use of conductive wires 24.

Referring to FIG. 3, a glass lid 26 is mounted on the window frame 14 by applying a sealing epoxy layer 28 on an upper peripheral end of the window frame 14. The assembly of the glass lid 26, the lead connecting frame 12, the window frame 14 and the ceramic base 16 is heated in a dust-free oven so as to cure and harden the sealing epoxy layer 28 and bond together the glass lid 26 and the window frame 14 so as to form a CCD image sensor IC package. The package shown in FIG. 3 is a conventional ceramic dual-in-line IC package.

Referring to FIGS. 4 and 5, when in use, the aforementioned IC package is mounted on a first layout surface of an FR4 printed circuit board 30, the pins 121 of the lead connecting frame 12 extending through and being fixed in pin holes 301 of the printed circuit board 30. It is noted that a gap (t) of approximately 0.4 to 0.8 mm is formed between the ceramic base 16 and the printed circuit board 30, thereby increasing the height of the assembly of the package and the printed circuit board 30 to increase correspondingly the size of the assembly. Furthermore, the distance between each two adjacent pins 121 of the lead connecting frame 12 and the distance between each bonding finger of the lead connecting frame 12 and the corresponding bonding pad of the CCD image sensor die 20 are fixed in order to extend the pins 121 of the lead connecting frame 12 through the pin holes 301 of the printed circuit board 30, thereby hindering further reduction in the dimensions of the die 20. Additionally, due to the presence of the pin holes 301, discrete components 31, which are mounted on a second layout surface of the printed circuit board 30 opposite to the first layout surface, cannot be arranged conveniently on the printed circuit board 30. Moreover, since the lead connecting frame 12 is required, the manufacturing cost of the CCD image sensor is increased. Lastly, the manufacturing process of the conventional CCD image sensor is complicated due to the need to prepare an image sensor IC package before mounting the IC package on a printed circuit board.

SUMMARY OF THE INVENTION

Therefore, the main objective of the present invention is to provide a method for manufacturing a hybrid circuit-type CCD image sensor which can overcome the aforementioned drawbacks that are associated with the prior art.

The second objective of the present invention is to provide a method for manufacturing a hybrid circuit-type CCD image sensor which can increase the resistance of the image sensor to thermal shock and corrosion.

According to the present invention, a method for manufacturing a hybrid circuit-type CCD image sensor includes the steps of: forming a lead wire unit on a first layout surface of a ceramic base; attaching a CCD image sensor die on the first layout surface; wire bonding the CCD image sensor die to the lead wire unit; mounting a window frame on the first layout surface to enclose the CCD image sensor die by applying a layer of sealing material on a lower peripheral end of the window frame; mounting a glass lid on the window frame by applying another layer of sealing material on an upper peripheral end of the window frame; and heating an assembly of the glass lid, the window frame and the ceramic base in an oven so as to cure and harden the layers of sealing material and bond together the glass lid, the window frame and the ceramic base.

BRIEF DESCRIPTION OF THE DRAWINGS

Other features and advantages of the present invention will become apparent in the following detailed description of the preferred embodiment, with reference to;the accompanying drawings, of which.

DETAILED DESCRIPTION OF THE PREFERRED EMBODIMENT

Figure 1:
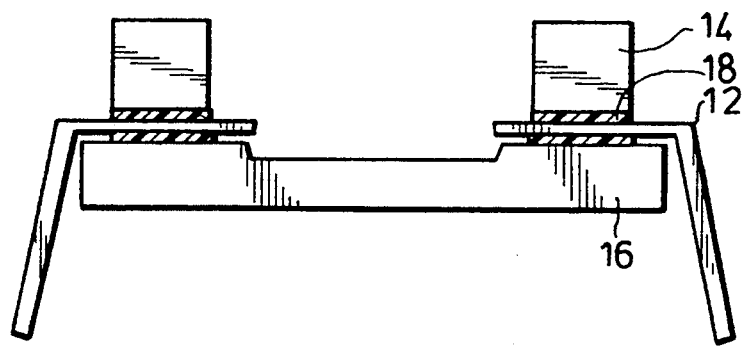
FIG. 1 is a schematic view showing an assembly of a ceramic base, a lead connecting frame and a window frame of a conventional CCD image sensor IC package.
Figure 2:
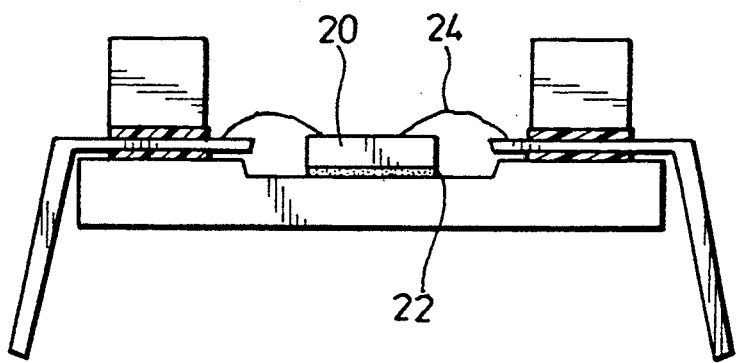
FIG. 2 is a schematic view similar to FIG. 1, illustrating a conventional CCD image sensor die mounted on the ceramic base.
Figure 3:
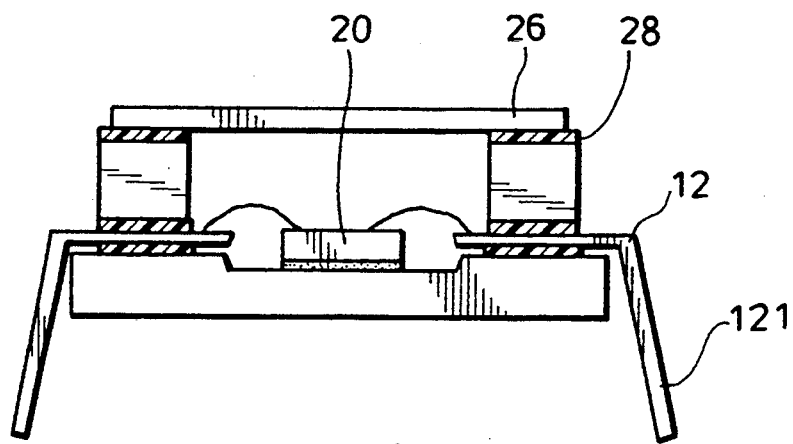
FIG. 3 is a schematic view similar to FIG. 2, illustrating a conventional glass lid mounted on the window frame.
Figure 4:
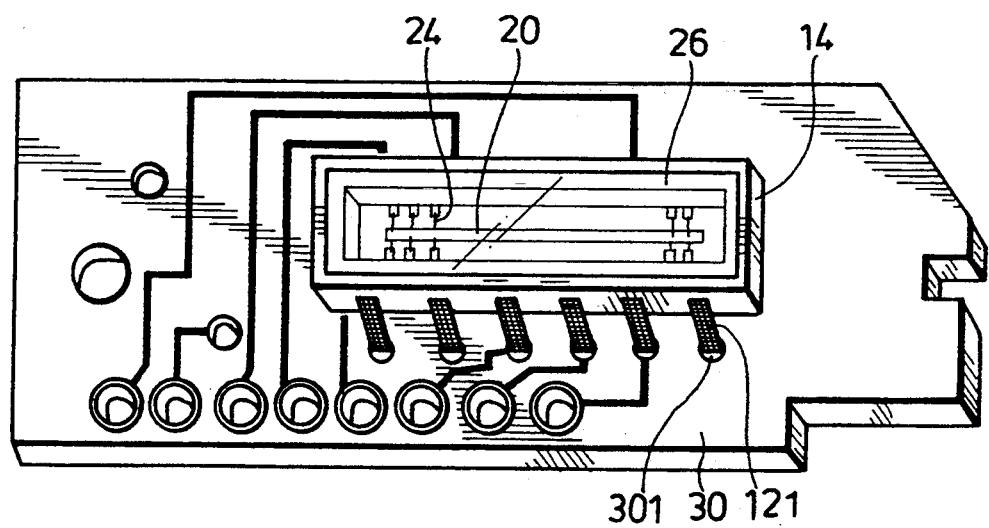
FIG. 4 is a schematic perspective view showing how a conventional CCD image sensor package is mounted on a conventional printed circuit board.
Figure 5:
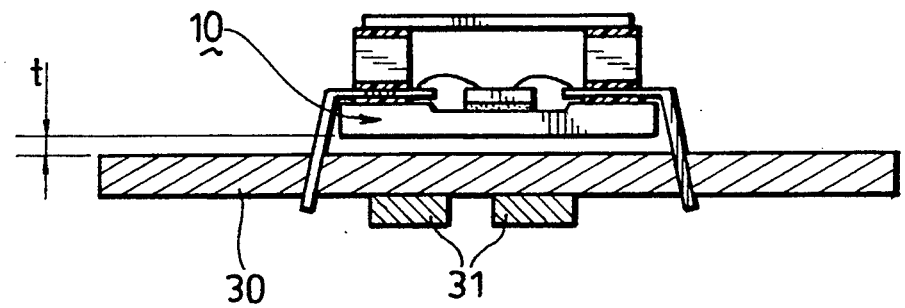
FIG. 5 is a schematic sectional view of FIG. 4.
Figure 6:
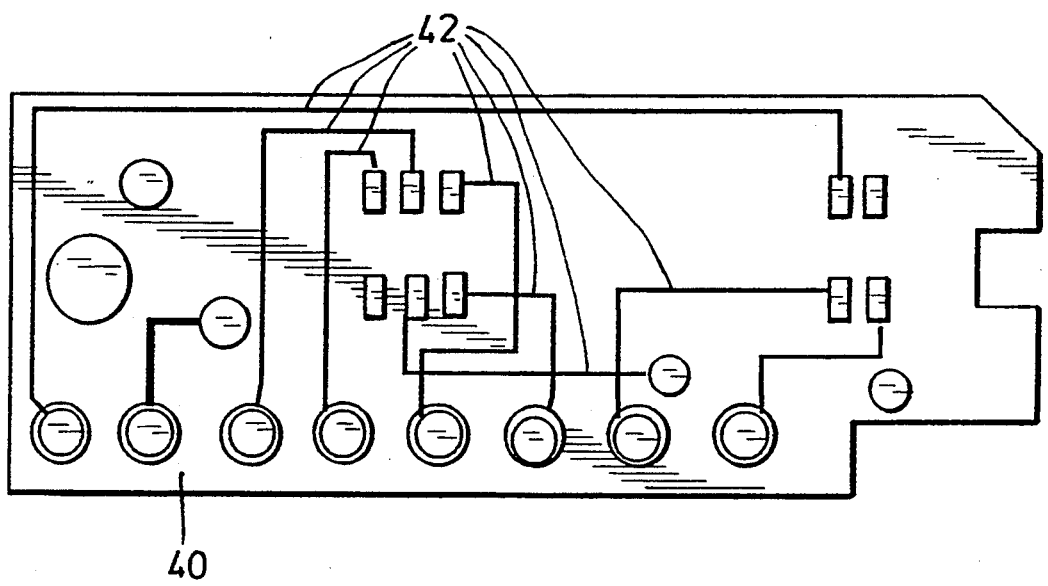
FIG. 6 is a schematic view showing a first layout surface of a ceramic base in accordance with the method of the present invention, wherein a lead wire unit is formed on the first layout surface.
Figure 7:
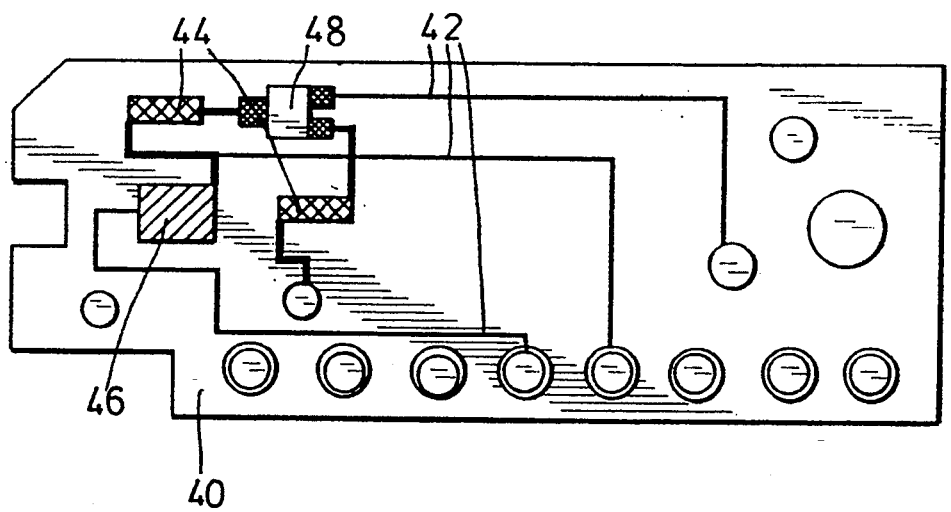
FIG. 7 is a schematic view showing a second layout surface of the ceramic base in accordance with the method of the present invention, wherein a lead wire unit is formed on the second layout surface and discrete components are mounted on the second layout surface.
Figure 8:
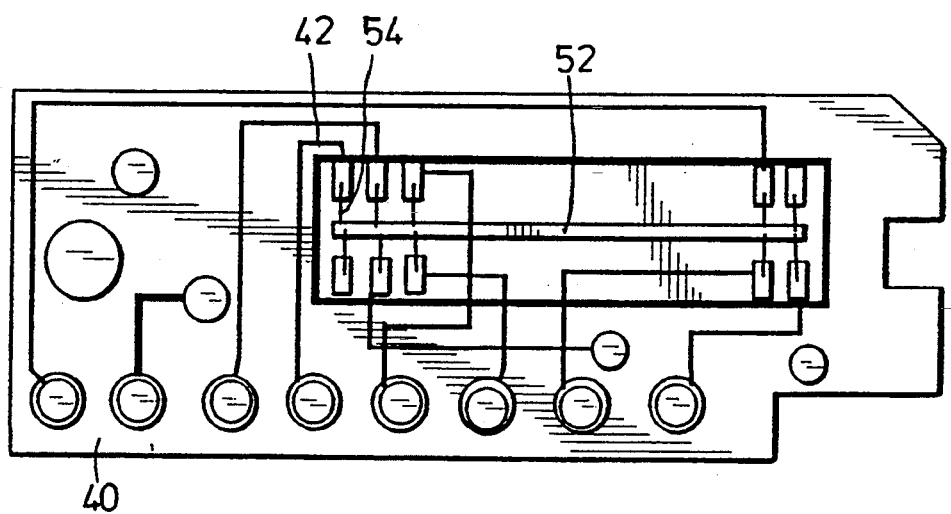
FIG. 8 is a schematic view showing the first layout surface of the ceramic base in accordance with the method of the present invention, wherein a window frame and a CCD image sensor die are mounted on the first layout surface.
Figure 9:
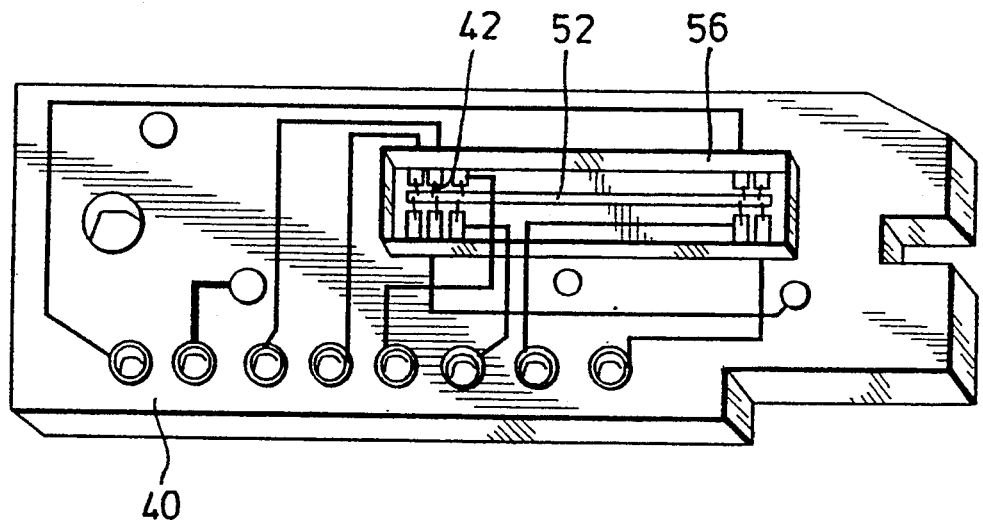
FIG. 9 is a perspective view of FIG. 8.
Figure 10:
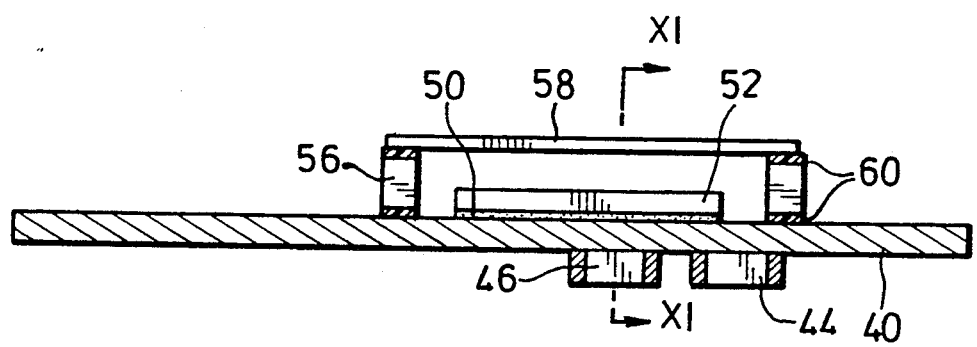
FIG. 10 is a schematic sectional view of FIG. 8, illustrating a glass lid mounted on the window frame.

Referring to FIGS. 6, 7 and 14, in accordance with the method of the present invention, a lead wire unit 42 is initially formed on first and second layout surfaces of a ceramic base 40. Discrete components 44,46,48 are then mounted on the second layout surface of the ceramic base 40 by means of known surface mounting techniques. The discrete components 44,46,48 may include resistors, capacitors, transistors, integrated circuit chips, etc.

Referring to FIGS. 8, 9, 10 and 13, a CCD image sensor die 52 is then attached on the first layout surface of the ceramic base 40 by applying a layer of conductive silver epoxy 50 on the first layout surface. The die 52 and the lead wire unit 42 are interconnected by means of conductive wires 54 that are installed with the use of a wire bonder (not shown). A window frame 56 is mounted on the first layout surface of the ceramic base 40 to enclose the die 52 by applying a layer of sealing material 60 on a lower peripheral end of the window frame 56. In the present embodiment, the sealing material may be sealing glass or epoxy. A glass lid 58 is then mounted on the window frame 56 by applying another layer of sealing material 60 on an upper peripheral end of the window frame 56.

Figure 11:
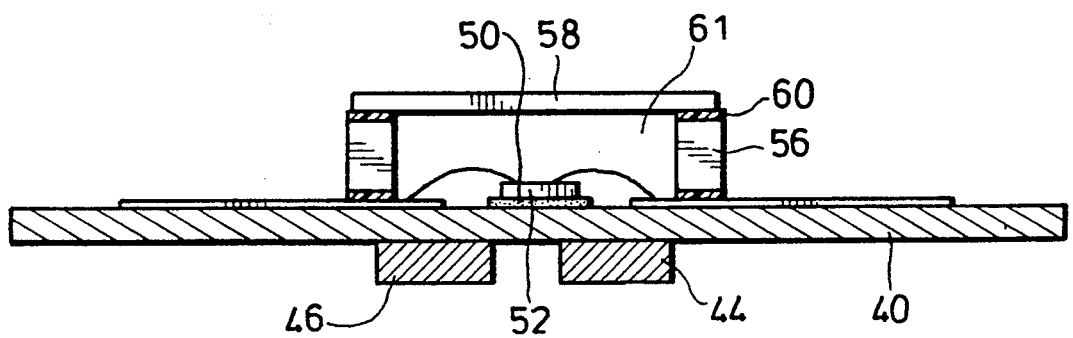
FIG. 11 is a cross-sectional view taken along the line XI—XI in FIG. 10.
Figure 12:
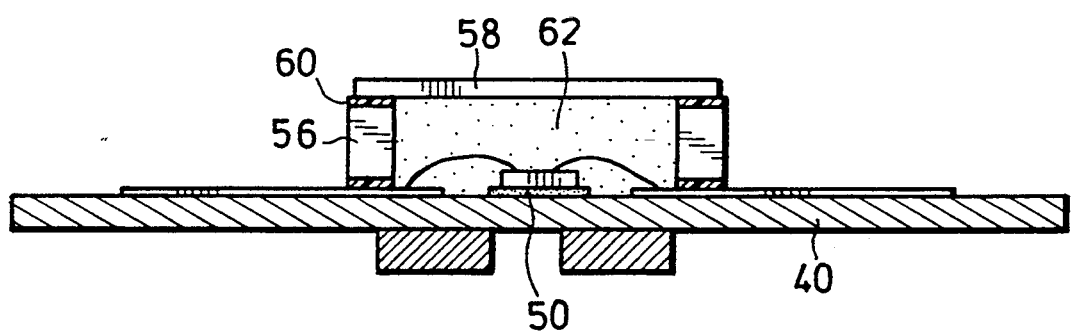
FIG. 12 is a cross-sectional view similar to FIG. 11, wherein nitrogen fills in a receiving space confined cooperatively by the glass lid, the window frame and the ceramic base.
Figure 13:
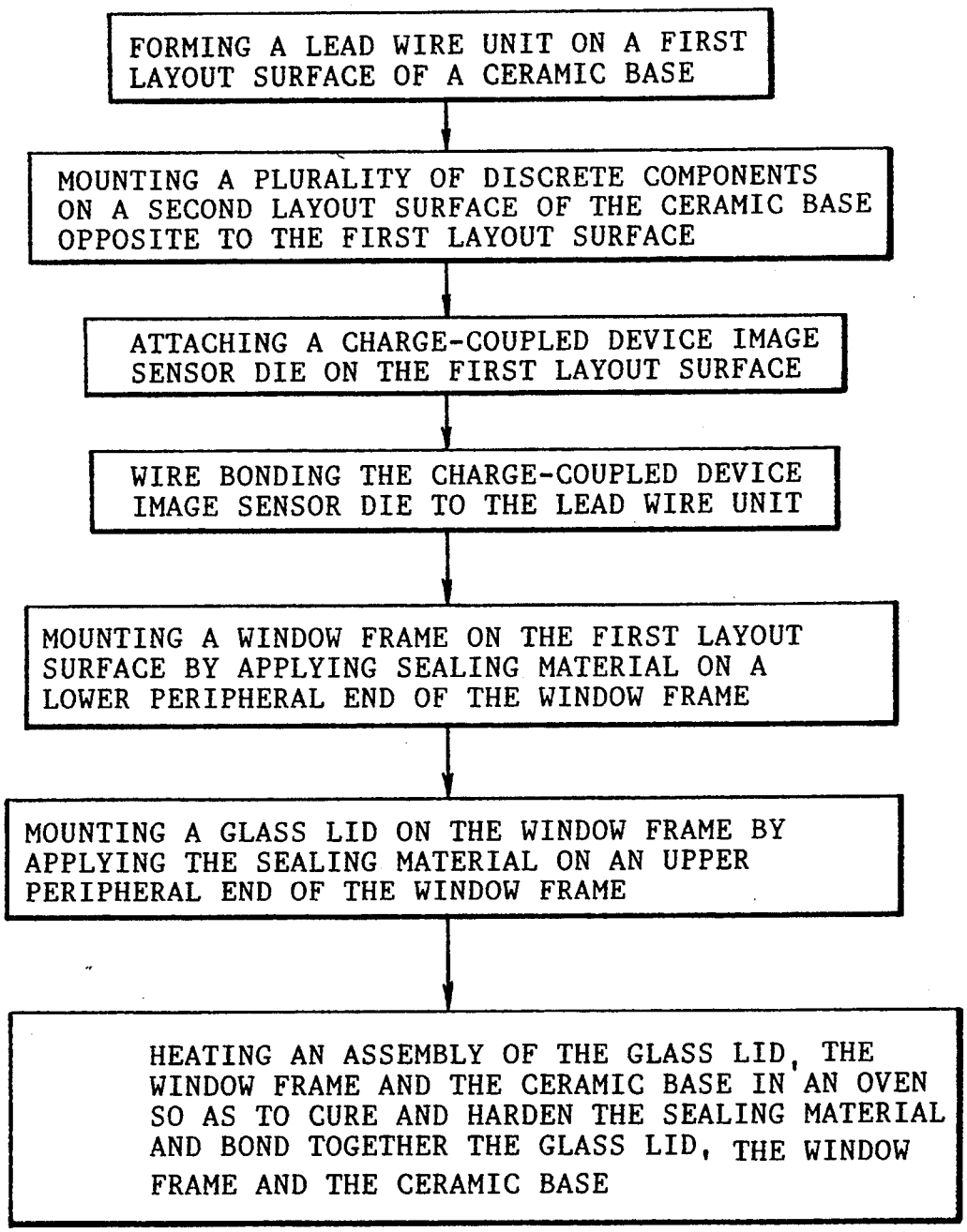
FIG. 13 is a block diagram illustrating the steps of the method according to the present invention.

Referring to FIGS. 11, 12 and 13, the assembly of the glass lid 58, the window frame 56 and the ceramic base 40 is then clamped by a clamping means (not shown) and is fed to an oven (not shown) so as to heat the same to cure and harden the sealing material and bond together the glass lid 58, the window frame 56 and the ceramic base 40. The oven is similar to that described above but is filled with nitrogen. Thus, the receiving space 61 confined by the assembly of the glass lid 58, the window frame 56 and the ceramic base 40 is filled with nitrogen 62 after heating. It should be noted that the oven is operated at a temperature of no more than 175° C. Such a temperature can be borne by the discrete components 44,46,48 since the latter can endure a temperature of over 200° C.

It should be appreciated that the window frame 56 prevents the glass lid 58 from direct contact with the die 52 so as to preclude the presence of heat stress at high temperatures. Furthermore, since the expansion coefficients of the glass lid 58, the window frame 56 and the ceramic base 40 are approximately equal, breakage of the glass lid 58, the window frame 56 and the ceramic base 40 is prevented when the CCD image sensor is exposed high temperature and high pressure conditions. Moreover, application of nitrogen in the receiving space 61 prevents the metallic components of the image sensor, such as the lead wire unit 42 and the conductive wires 54, from corroding.

Accordingly, the method of the present invention has the following advantages:

1. Since the die 52 is mounted on the first layout surface of the ceramic base 40 by means of known surface mounting techniques, no gap is formed between the ceramic base 40 and the die 52, thereby minimizing the size of the CCD image sensor.
2. Since there is no need to form the ceramic base 40 with pin holes, the mounting area for the discrete components 44,46,48 is maximized.
3. Since no lead frame is required, the image sensor is smaller and can be manufactured at a lower cost.
4. Unlike the conventional image sensor manufacturing method, the discrete components 44,46,48 and the die 52 are mounted on the layout surfaces of the ceramic base 40, thereby simplifying the manufacturing process.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

I claim:

1. A method for manufacturing a hybrid circuit charge-coupled device image sensor, said method comprising the steps of:
   (a) forming a lead wire unit on a first layout surface of a ceramic base;
   (b) attaching a charge-coupled device image sensor die on said first layout surface;
   (c) wire bonding said charge-coupled device image sensor die to said lead wire unit;
   (d) mounting a window frame on said first layout surface to enclose said charge-coupled device image sensor die by applying a layer of sealing material on a lower peripheral end of said window frame;
   (e) mounting a glass lid on said window frame by applying another layer of said sealing material on an upper peripheral end of said window frame; and
   (f) heating an assembly of said glass lid, said window frame and said ceramic base in an oven so as to cure and harden said layers of sealing material and bond together said glass lid, said window frame and said ceramic base.

2. A method for manufacturing a hybrid circuit charge-coupled device image sensor as claimed in claim 1, further comprising, prior to the step (b), a step of mounting a plurality of discrete components on a second layout surface of said ceramic base opposite to said first layout surface.

3. A method for manufacturing a hybrid circuit charged-coupled device image sensor as claimed in claim 1, wherein said oven is filled with nitrogen, a receiving space confined by said assembly of said glass lid, said window frame and said ceramic base being filled with nitrogen after said step (f) is performed.

4. A method for manufacturing a hybrid circuit charged-coupled device image sensor as claimed in claim 1, wherein said sealing material is epoxy.

5. A method for manufacturing a hybrid circuit charge-coupled device image sensor as claimed in claim 1, wherein said sealing material is sealing glass.

6. A method for manufacturing a hybrid circuit charge-coupled device image sensor as claimed in claim 1, wherein said step (b) comprises the step of using conductive silver epoxy to attach said charge-coupled device image sensor die on said first layout surface.

* * * * *